(12) United States Patent
Fenner et al.

(10) Patent No.: US 7,902,851 B2
(45) Date of Patent: Mar. 8, 2011

(54) HERMETICITY TESTING

(75) Inventors: Andreas Armin Fenner, Chandler, AZ (US); Geoffrey Batchelder, Chandler, AZ (US); Paul F. Gerrish, Phoenix, AZ (US); Lary R. Larson, Gold Canyon, AZ (US); Anna J. Malin, Mesa, AZ (US); Trevor D. Marrott, Mesa, AZ (US); Tyler Mueller, Phoenix, AZ (US); David A. Ruben, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 12/569,474

(22) Filed: Sep. 29, 2009

(65) Prior Publication Data
US 2010/0315110 A1 Dec. 16, 2010

Related U.S. Application Data

(60) Provisional application No. 61/235,745, filed on Aug. 21, 2009, provisional application No. 61/229,869, filed on Jul. 30, 2009, provisional application No. 61/229,867, filed on Jul. 30, 2009, provisional application No. 61/185,881, filed on Jun. 10, 2009.

(51) Int. Cl.
*G01R 31/02* (2006.01)
*G01R 31/26* (2006.01)
(52) U.S. Cl. ............................ 324/762.02; 324/762.06
(58) Field of Classification Search .................. None
See application file for complete search history.

(56) References Cited

U.S. PATENT DOCUMENTS

| | | | |
|---|---|---|---|
| 3,388,301 A | 6/1968 | James | |
| 3,943,557 A | 3/1976 | Frazee et al. | |
| 4,224,565 A | 9/1980 | Sosniak et al. | |
| 4,285,002 A | 8/1981 | Campbell | |
| 4,684,884 A | 8/1987 | Soderlund | |
| 4,773,972 A | 9/1988 | Mikkor | |
| 4,775,831 A | 10/1988 | Annamalai | |
| 4,868,712 A | 9/1989 | Woodman | |
| 4,870,224 A | 9/1989 | Smith et al. | |
| 5,059,899 A | 10/1991 | Farnworth et al. | |
| 5,381,039 A | 1/1995 | Morrison | |
| 5,381,804 A | 1/1995 | Shambroom | |
| 5,572,065 A | 11/1996 | Burns | |
| 5,592,391 A | 1/1997 | Muyshondt et al. | |
| 5,606,264 A | 2/1997 | Licari et al. | |
| 5,682,065 A | 10/1997 | Farnworth et al. | |
| 5,938,956 A | 8/1999 | Hembree et al. | |
| 5,955,789 A | 9/1999 | Vendramin | |
| 6,022,787 A | 2/2000 | Ma | |
| 6,032,064 A | 2/2000 | Devlin et al. | |
| 6,074,891 A | 6/2000 | Staller | |
| 6,297,072 B1 | 10/2001 | Tilmans et al. | |
| 6,297,551 B1 | 10/2001 | Dudderar et al. | |
| 6,298,255 B1 | 10/2001 | Cordero et al. | |
| 6,303,977 B1 | 10/2001 | Schroen et al. | |
| 6,323,550 B1 | 11/2001 | Martin et al. | |
| 6,394,953 B1 | 5/2002 | Devlin et al. | |

(Continued)

OTHER PUBLICATIONS

U.S. Appl. No. 12/569,431, filed Sep. 29, 2009, Gerrish et al.

(Continued)

*Primary Examiner* — Ha Tran T Nguyen
*Assistant Examiner* — Roberto Velez
(74) *Attorney, Agent, or Firm* — Carol F. Barry

(57) ABSTRACT

Electrical circuit apparatus and methods including hermeticity testing structures for testing the hermeticity of the electrical circuit apparatus.

20 Claims, 8 Drawing Sheets

U.S. PATENT DOCUMENTS

| | | |
|---|---|---|
| 6,486,534 B1 | 11/2002 | Sridharan et al. |
| 6,500,694 B1 | 12/2002 | Enquist |
| 6,514,798 B2 | 2/2003 | Farnworth |
| 6,515,870 B1 | 2/2003 | Skinner et al. |
| 6,516,808 B2 | 2/2003 | Schulman |
| 6,555,856 B1 | 4/2003 | Staller |
| 6,563,133 B1 | 5/2003 | Tong |
| 6,566,736 B1 | 5/2003 | Ogawa et al. |
| 6,638,784 B2 | 10/2003 | Bartlett et al. |
| 6,696,369 B2 | 2/2004 | Fraser et al. |
| 6,718,206 B2 | 4/2004 | Casavant |
| 6,774,327 B1 | 8/2004 | Wong |
| 6,822,326 B2 | 11/2004 | Enquist et al. |
| 6,867,073 B1 | 3/2005 | Enquist |
| 6,902,987 B1 | 6/2005 | Tong et al. |
| 6,903,918 B1 | 6/2005 | Brennan |
| 6,962,835 B2 | 11/2005 | Tong et al. |
| 7,096,580 B2 | 8/2006 | Gonzalez et al. |
| 7,109,092 B2 | 9/2006 | Tong |
| 7,205,181 B1 | 4/2007 | MacIntyre |
| 7,238,999 B2 | 7/2007 | LaFond et al. |
| 7,247,517 B2 | 7/2007 | Rumer et al. |
| 2004/0222478 A1 | 11/2004 | Zhang et al. |
| 2005/0009246 A1 | 1/2005 | Enquist et al. |
| 2005/0065565 A1 | 3/2005 | Kramer et al. |
| 2006/0033204 A1 | 2/2006 | Fraser et al. |
| 2006/0264004 A1 | 11/2006 | Tong et al. |
| 2007/0037379 A1 | 2/2007 | Enquist et al. |
| 2007/0251338 A1 | 11/2007 | Wiese et al. |

OTHER PUBLICATIONS

U.S. Appl. No. 12/569,504, filed Sep. 29, 2009, Mueller et al.
U.S. Appl. No. 12/569,525, filed Sep. 29, 2009, Mueller et al.
Lea et al., "DRIE from MEMS to wafer-level packaging," *Solid State Technology*, Dec. 2007; 50(12), 8 pgs. Retrieved online on Oct. 11, 2010. Available online at <url:http://www.electroiq.com/ElectroIQ/en-us/index/display/Semiconductor_Article_Tools_Template.articles. solid-state-technology.volume-50.issue-12.features.mems.drie-from-mems-to-wafer-level-packaging.html>.
Pham et al., "High-aspect-ratio bulk micromachined vias contacts," ProcSAFE & Prorisc 2004, Veldhoven, NL, Nov. 25-26, 2004, pp. 742-746.

HERMETICITY TESTING

CROSS-REFERENCE TO RELATED APPLICATIONS

This application claims the benefit of U.S. Provisional Application Ser. No. 61/185,881 filed 10 Jun. 2009, entitled "FARADAY CAGE FOR CIRCUITRY USING SUBSTRATES," U.S. Provisional Application Ser. No. 61/229,867 filed 30 Jul. 2009, entitled "APPARATUS FOR RESTRICTING MOISTURE INGRESS," U.S. Provisional Application Ser. No. 61/229,869 filed 30 Jul. 2009, entitled "HERMETICITY TESTING," and U.S. Provisional Application Ser. No. 61/235,745 filed 21 Aug. 2009, entitled "HERMETICALLY-SEALED ELECTRICAL CIRCUIT APPARATUS," all of which are incorporated herein by reference in their respective entireties.

BACKGROUND

The disclosure herein relates generally to apparatus and methods for hermeticity testing, and further to fabrication methods for constructing such apparatus.

Electrical circuits (e.g., integrated circuits) include many types of active and passive devices (e.g., transistors, capacitors, resistors, etc.) that may be subject to damage from moisture (e.g., corrosion and functional changes to the system). For example, moisture may affect the operation and performance of circuitry, such as sensitive circuits used in implantable medical devices (e.g., sensor circuitry, pacing circuitry, timing circuitry, etc.).

Various attempts have previously been made to test the hermeticity of electrical circuit apparatus. For example, U.S. Pat. No. 4,775,831 entitled "IN-LINE DETERMINATION OF PRESENCE OF LIQUID PHASE MOISTURE IN SEALED IC PACKAGES," issued on Oct. 4, 1988, describes measuring the conductance and capacitance of an integrated circuit at a temperature that is above temperatures which allow moisture to condense, subsequently measuring the conductance and capacitance of the integrated circuit at a temperature that allows moisture to condense, and comparing the two measured conductances and capacitances to determine the hermeticity of the integrated circuit. Further, for example, U.S. Pat. No. 5,606,264 entitled "MOISTURE SENSOR FOR ELECTRONIC MODULES," issued on Feb. 25, 1997, describes utilizing a moisture sensing circuit formed of loosely spaced conductor lines consisting of migratory metal, which reacts to moisture.

SUMMARY

The disclosure herein relates generally to apparatus for hermeticity testing, methods of fabrication of such apparatus, and methods for testing such apparatus for hermeticity. For example, as described in one or more embodiments herein, semiconductor substrates and semiconductor fabrication techniques may be used to provide a testing structure around one or more hermetically-sealed regions of a circuit device (e.g., a die that includes circuitry).

One exemplary apparatus disclosed herein includes electrical circuit apparatus including a first portion, a second portion, and one or more circuit devices (e.g., including electrical circuitry, forming a part of an implantable medical device, etc.). The first portion includes a first chain-structure portion of a testing structure. Further, the first portion includes a substantially-planar connection surface, a substrate (e.g., a semiconductor substrate) provided from a wafer, and one or more chain-structure segments forming at least a part of the first chain-structure portion. Each chain-structure segment includes two connection pads exposed at the connection surface and an electrical interconnect electrically coupling the two connection pads. The second portion includes a second chain-structure portion of the testing structure. Further, the second portion includes a substantially-planar connection surface, a substrate (e.g., a semiconductor substrate) provided from a wafer, and one or more chain-structure segments forming at least a part of the second chain-structure portion. Each chain-structure segment includes two connection pads exposed at the connection surface and an electrical interconnect electrically coupling the two connection pads. The one or more circuit devices are located in one or more hermetically-sealed regions. Further, the connection surface of the first portion is bonded to the connection surface of the second portion and each connection pad of one or more chain-structure segments of the first portion is electrically coupled to a connection pad of the one or more chain-structure segments of the second portion to form the testing structure. The testing structure includes at least one series circuit (e.g., at least two series circuits interleaved with each other) extending from a first end to a second end around the one or more hermetically-sealed regions and aimed at an interface of the connection surface of the first portion and the connection surface of the second portion. In at least one embodiment, the first portion further includes one or more layers formed on the substrate terminating at the connection surface and the one or more layers of the first portion include each chain-structure segment of the first portion and/or a circuit device of the one or more circuit devices. Further, the second portion includes one or more layers formed on the substrate terminating at the connection surface and the one or more layers of the second portion include each chain-structure segment of the second portion and/or a circuit device of the one or more circuit devices.

One exemplary method disclosed herein includes forming an electrical circuit apparatus. The method includes providing a first portion, providing a second portion, and providing one or more circuit devices (e.g., including electrical circuitry, forming a part of an implantable medical device, etc.). The first portion includes a first chain-structure portion of a testing structure and a substantially-planar connection surface. Providing the first portion includes providing a substrate (e.g., a semiconductor substrate) provided from a wafer and providing one or more chain-structure segments. The one or more chain-structure segments form at least a part of the first chain-structure portion and each chain-structure segment includes two connection pads exposed at the connection surface and an electrical interconnect electrically coupling the two connection pads. The second portion includes a second chain-structure portion of the testing structure and a substantially-planar connection surface. Providing the second portion includes providing a substrate (e.g., a semiconductor substrate) provided from a wafer and providing one or more chain-structure segments. The one or more chain-structure segments form at least a part of the second chain-structure portion and each chain-structure segment includes two connection pads exposed at the connection surface and an electrical interconnect electrically coupling the two connection pads. Further, the one or more circuit devices are located in one or more hermetically-sealed regions. The method further includes bonding the connection surface of the first portion to the connection surface of the second portion, e.g., such that each connection pad of one or more chain-structure segments of the first portion is electrically coupled to a connection pad of the one or more chain-structure segments of the second portion to form the testing structure. Further, the testing structure includes at least one series circuit (e.g., at least two series circuits interleaved with each other) extending from a first end to a second end around the one or more hermetically-sealed regions and formed at an interface of the connection surface of the first portion and the connection surface of the second portion.

Another exemplary method disclosed herein includes testing an electrical circuit apparatus. The method includes providing an electrical circuit apparatus. The apparatus includes a first portion, a second portion, and one or more circuit devices (e.g., including electrical circuitry, forming a part of an implantable medical device, etc.). The first portion includes a first chain-structure portion of a testing structure. Further, the first portion includes a substantially-planar connection surface, a substrate (e.g., a semiconductor substrate) provided from a wafer, and one or more chain-structure segments forming at least a part of the first chain-structure portion. Each chain-structure segment includes two connection pads exposed at the connection surface and an electrical interconnect electrically coupling the two connection pads. The second portion includes a second chain-structure portion of the testing structure. Further, the second portion includes a substantially-planar connection surface, a substrate (e.g., a semiconductor substrate) provided from a wafer, and one or more chain-structure segments forming at least a part of the second chain-structure portion. Each chain-structure segment includes two connection pads exposed at the connection surface and an electrical interconnect electrically coupling the two connection pads. The one or more circuit devices define one or more hermetically-sealed regions. Further, the connection surface of the first portion is bonded to the connection surface of the second portion, wherein each connection pad of one or more chain-structure segments of the first portion is electrically coupled to a connection pad of the one or more chain-structure segments of the second portion to form the testing structure. The testing structure includes at least one series circuit extending from a first end to a second end around the one or more hermetically-sealed regions and formed at an interface of the connection surface of the first portion and the connection surface of the second portion. The method further includes testing the at least one series circuit of the testing structure to confirm or validate hermeticity about the one or more hermetically-sealed areas (e.g., determining if the at least one series circuit is open, determining if a first series circuit of the at least two series circuits is shorted to a second series circuit of the at least two series circuits, etc.).

The above summary is not intended to describe each embodiment or every implementation of the present disclosure. A more complete understanding will become apparent and appreciated by referring to the following detailed description and claims taken in conjunction with the accompanying drawings.

DETAILED DESCRIPTION OF EXEMPLARY EMBODIMENTS

Figure 1A:
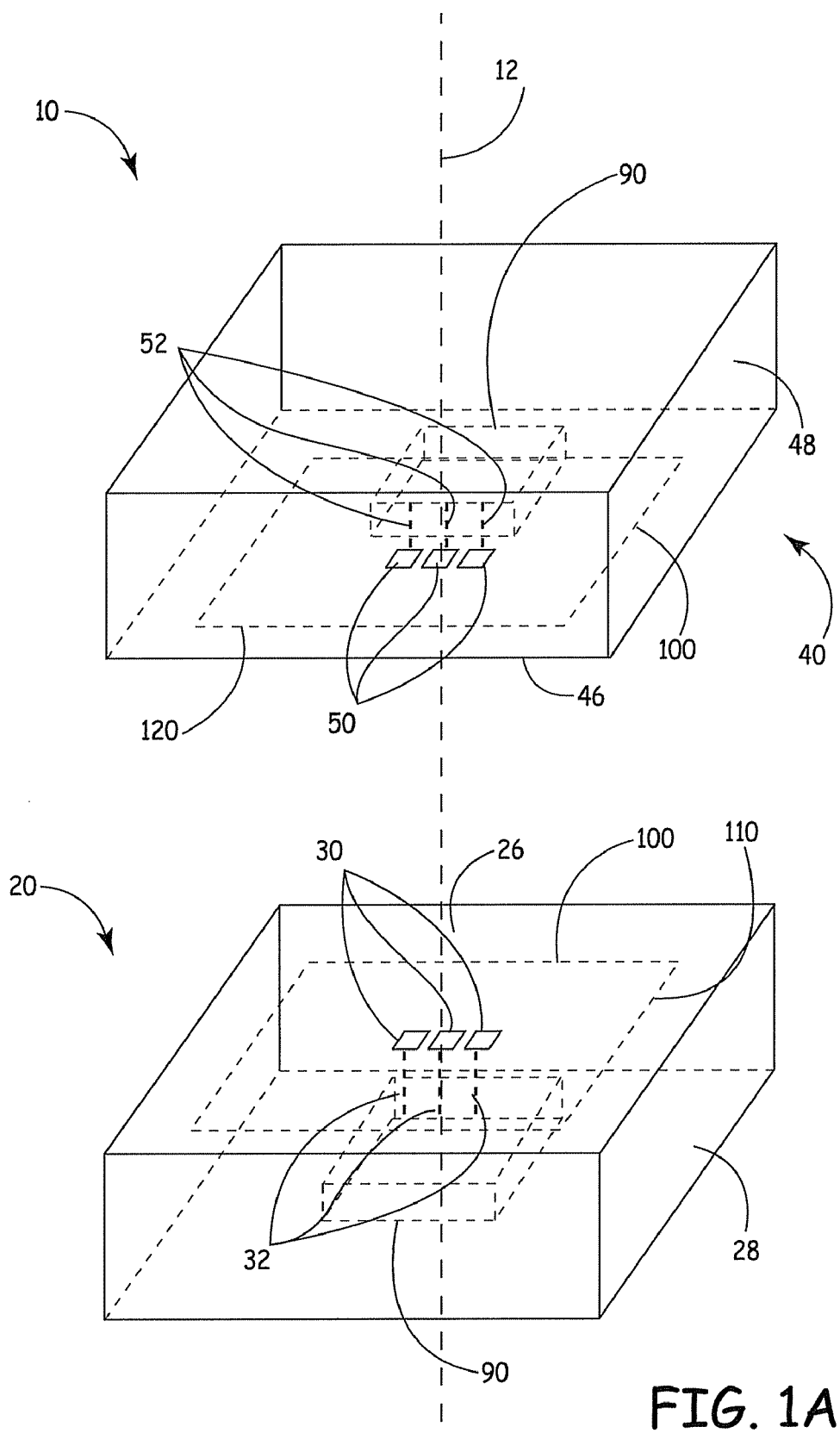
FIGS. 1A-1B are generalized illustrative exploded and assembled perspective views, respectively, of one exemplary embodiment of an electrical circuit apparatus including a hermeticity testing structure.

In the following detailed description of illustrative embodiments, reference is made to the accompanying figures of the drawing which form a part hereof, and in which are shown, by way of illustration, specific embodiments which may be practiced. It is to be understood that other embodiments may be utilized and structural changes may be made without departing from (e.g., still falling within) the scope of the disclosure presented hereby.

Exemplary apparatus, and methods of constructing such apparatus, shall be described with reference to FIGS. 1-7. It will be apparent to one skilled in the art that elements from one embodiment may be used in combination with elements of the other embodiments, and that the possible embodiments of such apparatus using combinations of features set forth herein is not limited to the specific embodiments shown in the Figures and/or described herein. Further, it will be recognized that the embodiments described herein may include many elements that are not necessarily shown to scale. Further, it will be recognized that the size and shape of various elements herein may be modified but still fall within the scope of the present disclosure, although one or more shapes and/or sizes, or types of elements, may be advantageous over others.

Figure 1B:
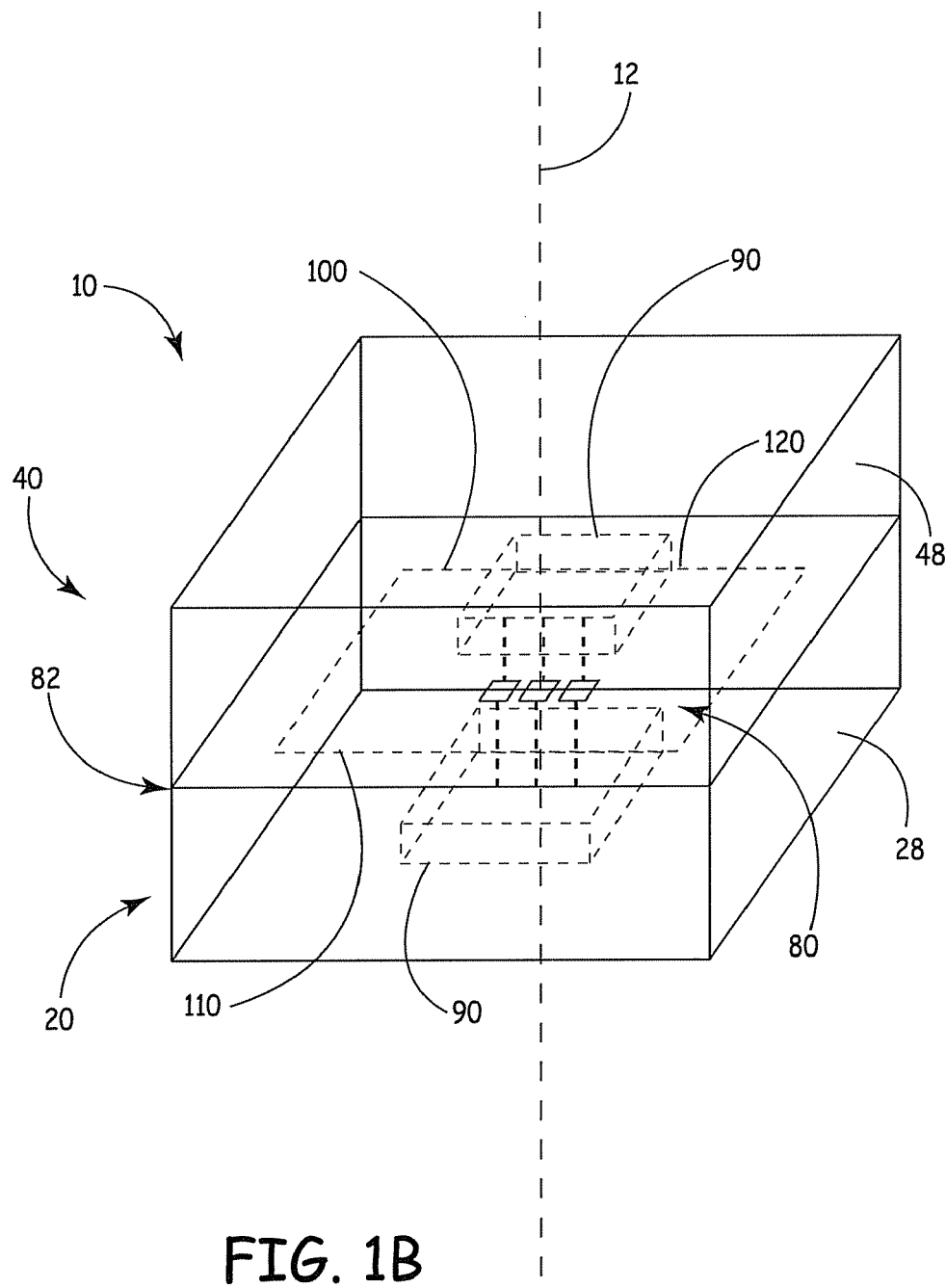

FIGS. 1A-1B show generalized exploded and assembled perspective views of components which may form a part of an exemplary apparatus 10 that when assembled includes one or more circuit devices 90 located along an axis 12 and within in one or more hermetically-sealed regions 80 (see FIG. 1B) and a testing structure 100 extending (represented schematically by a dashed line) around or at least partially around the one or more hermetically-sealed regions 80 along a plane orthogonal to the axis 12. The testing structure 100 may be located around the one or more circuit devices 90 at a distance further away from the axis 12 than the one or more devices 90 and located within the hermetically-sealed regions 80.

Although not limited thereto, in one or more embodiments, the apparatus 10 is beneficial for the circuitry of a package used in implantable medical devices. For example, the apparatus 10 including the testing structure 100 may be a part of an implantable medical device. For example, the implantable medical device may be a device implantable in a body near a human heart. For example, the implanted medical device may be any implantable cardiac pacemaker, defibrillator, cardioverter-defibrillator, or pacemaker-cardioverter-defibrillator (PCD). Further, for example, the implantable medical device may be an implantable nerve stimulator or muscle stimulator, an implantable monitoring device (e.g., a hemodynamic monitoring device), a brain stimulator, a gastric stimulator, a drug pump, or any other implantable device that would benefit from moisture protection. As used herein, "moisture" may be defined as any material capable of ingressing into semiconductor devices. For example, moisture may include water, biological liquids, vapors, gases, etc. Therefore, the apparatus 10 may find wide application in any form of implantable medical device. As such, any description herein making reference to any particular medical device is not to be taken as a limitation of the type of medical device which can benefit from and which can employ the testing structure 100 as described herein.

Further, although the testing structure 100 may be beneficial for implantable medical devices, such structure is not limited to such applications. For example, such testing structure may be beneficial for many different types of circuitry (e.g., whether for medical use or not, whether for an implantable medical device or not). For example, one or more types of circuits that may benefit from such testing structure may include circuits such as sensor circuits, pacing circuits, timing circuits, telemetry circuits, etc.

The apparatus 10, as shown generally in the exploded views of FIGS. 1A-1B, includes a first portion 20 and a second portion 40. The first portion 20 includes at least one side surface 28 (e.g., one side surface, four side surfaces, etc.) substantially parallel to the axis 12 and at least a substantially planar connection surface 26 substantially orthogonal to the axis 12. The second portion 40 also includes at least one side surface 48 (e.g., one side surface, four side surfaces, etc.) substantially parallel to the axis 12 and at least a substantially planar connection surface 46 substantially orthogonal to the axis 12.

The one or more circuit devices 90 may be formed in one or both (in both, as shown) of the first portion 20 and the second portion 40 lying along axis 12. Further, although not depicted, one or both of the first portion 20 and the second portion 40 may define a cavity and at least one of the one or more circuit devices 90 may be located within the cavity. Further, the one or more circuit devices 90 may be provided and located in any manner within the hermetically-sealed regions 80. As used herein, the one or more circuit devices 90 may be any device or devices that include electrical circuitry that performs one or more functions (e.g., die containing circuitry).

The first portion 20 includes a first chain-structure portion 110 of the testing structure 100 and the second portion 40 includes a second chain-structure portion 120 of the testing structure 100. When assembled and/or coupled together to form interface 82 (e.g., the connection surface 26 of the first portion 20 is bonded (e.g., oxide bonded) to the connection surface 46 of the second portion 40, or in other words, to, e.g., form a face-to-face bonded die), the first chain-structure portion 110 and the second chain-structure portion 120 of the first and second portions 20, 40, respectively, form the testing structure 100. Generally, the testing structure 100 may be utilized to test the hermeticity of the one or more hermetically-sealed regions 80 of the apparatus 10.

The testing structure 100 may take any shape or size suitable for its intended purpose. For example, the testing structure 100 may be rectangular in shape (e.g., with four side), circular in shape (e.g., a single circular side), etc. Further, for example, the shape of the testing structure 100 may not be describable by a particular shape (e.g., in the case where, for example, the structure is shaped to conform to a region that it extends around). Still further, in one or more embodiments, the testing structure 100 may only occupy a portion of the apparatus 10 to surround specific hermetically-sealed regions that may contain moisture sensitive circuitry (see, e.g., FIGS. 5A-5B). Yet still further, in or more embodiments, the testing structure 100 may only extend around a portion of a hermitically-sealed region, e.g., a single side, two or more sides, etc.

Although the first and the second chain-structure portions 110, 120 are represented schematically as dashed lines in FIGS. 1A-1B, each of the first and the second portions 20, 40 may include one or more chain-structure segments that form at least part of the chain-structure portions 110, 120 of the testing structure 100. Such chain-structure segments are described herein with further detail in reference to FIGS. 2-5.

Further, the testing structure 100 includes at least one series circuit extending from a first end to a second end around the one or more hermetically-sealed regions 80 and formed at the interface 82 (see FIG. 1B) of the connection surface 26 of the first portion 20 and the connection surface 46 of the second portion. The at least one series circuit of the testing structure 100 may be utilized to, e.g., confirm or validate hermeticity about the one or more hermetically-sealed areas 80. Such methods are described herein with further detail in reference to FIGS. 6-7.

Wafer scale fabrication techniques may be used to form each of the first and second portions 20, 40. In one or more embodiments, each of the first portion 20 and the second portion 40 includes a substrate provided from or as a part of a wafer (e.g., a portion of any size and shape of substrate usable in wafer scale fabrication processes, such as a circular silicon wafer, a glass substrate, etc.). In other words, multiple portions may be fabricated on a wafer (e.g., the first portions on a first wafer and the second portions on a second wafer). As such, the fabrication of each of the portions may be initiated with use of a wafer substrate (e.g., a semiconductor, conductor, or insulator substrate wafer). In one or more embodiments, the wafer substrate is a doped semiconductor wafer substrate (e.g., doped to either a bulk n-type or p-type wafer), such as those used as the base substrate for microelectronic devices (e.g., substrates built in and over using one or more microfabrication process steps such as doping, ion implantation, etching, deposition of various materials, and photolithographic patterning processes). In one or more embodiments, the semiconductor wafer is a silicon wafer. However, other available types of semiconductor wafers may be used, such as, for example, a gallium arsenide wafer, a germanium wafer, a silicon on insulator (SOI) wafer, etc. Further, for example, in one or more embodiments, the substrate may be formed of one or more materials other than semiconductor material, such as a glass substrate, wherein the substrate includes a metal film. In other words, for example, the first portion 20 may include a substrate provided from or as a part of a wafer and the second portion 40 may include a substrate provided from or as a part of a wafer (see, e.g., FIGS. 2-3).

In one or more embodiments, the first portion 20 and the second portion 40 may include one or more layers (see, e.g., FIGS. 2-3) formed on a substrate (e.g., directly on a semiconductor substrate) terminating at the connection surfaces 26, 46, respectively. The one or more layers may include the one or more circuit devices 90 and/or the first and the second chain-structure portions 110, 120 forming the testing structure 100. Such layers are described herein with further detail in reference to FIGS. 2-3.

The first portion 20 and the second portion 40 may further include one or more contact pads 30, 50, respectively, electrically coupled to the one or more circuit devices 90 using one or more interconnects 32, 52 (represented schematically with dashed lines) and located at the connection surfaces 26, 46. When the first portion 20 is assembled with the second portion 40, the contact pads 30, 50 are electrically coupled such that the one or more circuit devices 90 are electrically coupled. Further, although not depicted, the apparatus 10 (e.g., the first portion 20 and/or the second portion 40) may include one or more additional interconnects extending between the circuit devices 90 and an outer surface of the apparatus 10.

As described herein, one or both of the first portion 20 and the second portion 40 may define a cavity within which the one or more circuit devices 90 may be located. In this embodiment, the one or more circuit devices 90 may be directly electrically coupled to the one or more contacts pads 30, 50 without the use of interconnects (e.g., interconnects 32, 52). For example, at least in one embodiment, the second portion 40 defines a cavity extending into the connection surface 46. A circuit device 90 may be located within the cavity and electrically coupled to the contact pads 30 of the first portion 20.

At least in one embodiment, connection surface 26, which may be defined at least partly by one or more layers, may include oxide material. For example, such oxide material may be oxide material formed, deposited or grown as part of one or more processing steps (e.g., oxides such as BPSG, silicon oxide, native oxide, etc.).

The one or more circuit devices 90, the first and the second chain-structure portions 110, 120, the one or more interconnects 32, 52, and the one or more contact pads 30, 50 may be formed using standard microelectronic fabrication processing techniques (e.g., such as etching of materials, deposition of materials, and photolithographic patterning process steps, etc.). Various portions of first and second portions 20, 40 may be formed during the same or different processing steps. For example, a portion of an interconnect that may be used to provide a portion of first chain-structure portion 110 may be formed within layer used to provide a portion of the interconnect 32 or contact pad 30. The present disclosure is not limited to any particular processing, or timing or order, of such process steps. However, some types of processing and order thereof may be beneficial over other types.

To form the apparatus 10, the first portion 20 and the second portion 40 are coupled together. For example, in one or more embodiments, the connection surfaces 26, 46 may be coupled (e.g., using plasma-enhanced bonding) together to assemble the apparatus 10 and to form interface 82. In one or more embodiments, bonding the first and second portions 20, 40 together to assemble the apparatus 10 may be implemented using any wafer and/or die bonding process (e.g., bonding a wafer including the first portions with a wafer including the second portions, which also refers to the bonding of an individual die to a full wafer and the bonding of an individual die to another individual die), such as chemical bonding processes (e.g., those using adhesion promoters, etc.), high temperature bonding processes (e.g., thermal fusion bonding, etc.), hydrogen bonding processes, anodic bonding processes, and oxide bonding processes (e.g., plasma enhanced bonding, etc.). For example, use of oxide bonding permits oxide surfaces (e.g., portions of the connection surfaces 26, 46 of the first and second portions 20, 40 including an oxide material, such as silicon oxide) to be bonded together. Further, for example, in one or more embodiments, the connection surfaces 26, 46 may be chemical mechanically polished or planarized to expose any conductive portions thereof (e.g., the contact pads 30, 50 at connection surfaces 26, 46) to be exposed. For example, when the oxide portions and the conductive portions (e.g., the first chain-structure portion 110 or contact pads 30) located at the connection surface 26 (e.g., a planar surface) are aligned with the oxide portions and the conductive portions (e.g., the first chain-structure portion 110 or contact pads 50) located at the connection surface 46 (e.g., a planar surface), oxide bonding may be performed. For example, oxide bonding processes may form a bond between oxide portions of the connection surfaces 26, 46 of the first and second portions 20, 40 without the need for adhesives or other intermediate layers may be used.

Figure 2:
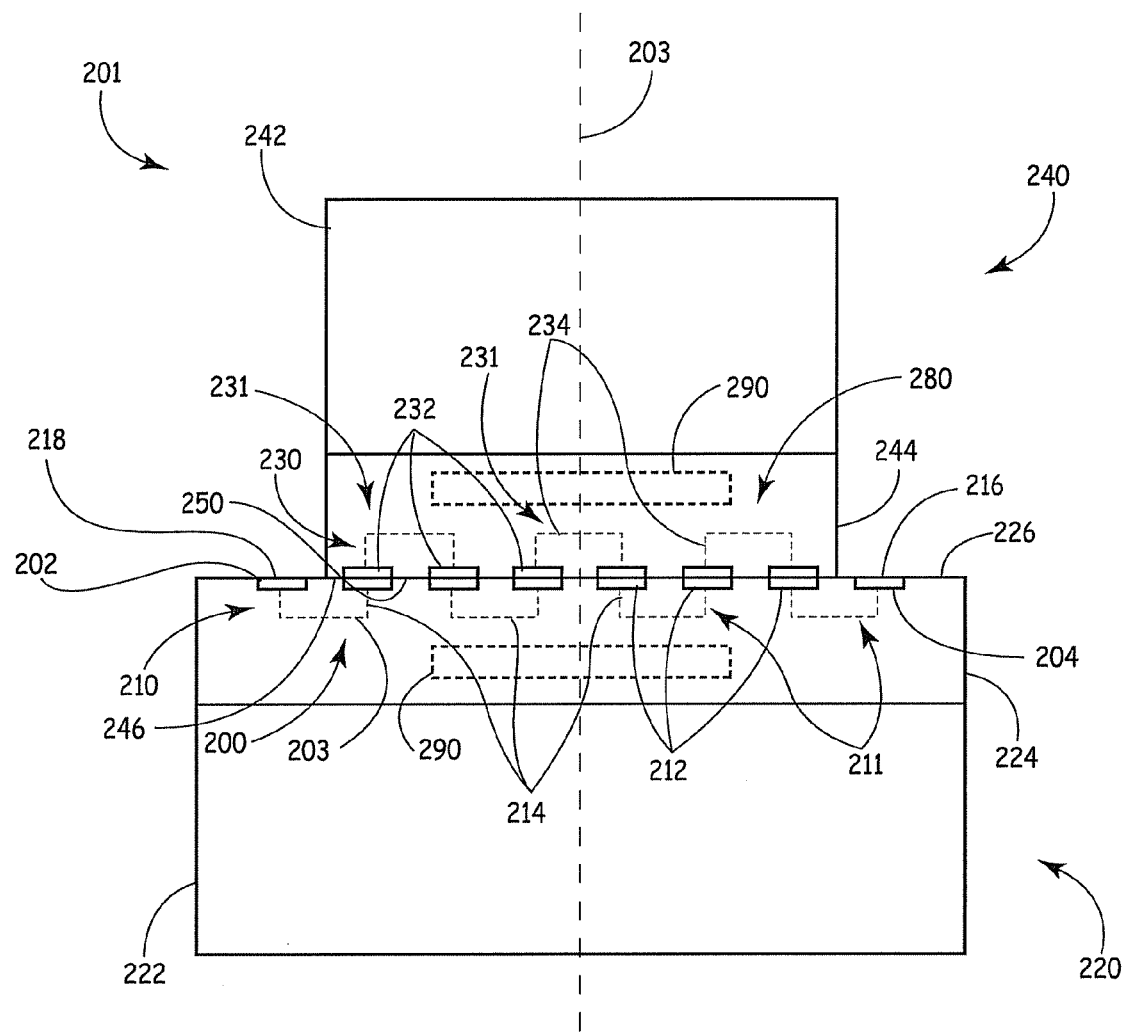
FIG. 2 is an illustrative cross-sectional side view of one exemplary embodiment of an apparatus such as generally shown in FIGS. 1A-1B.

FIG. 2 is a schematic cross-sectional side view of one exemplary embodiment of an apparatus 201 that includes a first portion 220 bonded to a second portion 240. The first portion 220 includes a substrate 222 and the second portion 240 also includes a substrate 242. Substrates 222, 242 may be provided from or as a part of a wafer (e.g., a doped or an undoped silicon wafer, or an insulating wafer such as glass or plastic).

The first portion 220 includes one or more layers 224 formed on the substrate 222 terminating at a substantially planar connection surface 226 that is orthogonal to axis 203. In this embodiment, the first portion 220 is larger than the second portion 240 such that, when bonded together, regions of the connection surface 226 are exposed, e.g., to provide contact pads for connections outside of the apparatus 201. In other embodiments, the first portion 220 and the second portion 240 may be any size relative to each so as to provide suitable functionality to the apparatus 201.

The second portion 240 also includes one or more layers 244 formed on the substrate 242 terminating at a substantially planar connection surface 246 that is orthogonal to axis 203. The one or more or layers 224, 244 of either portion 220, 240 may also provide one or more circuit devices 290 arranged along axis 203. Further, the one or more layers 224, 244 of either portion 220, 240 may include any number of layers desired for providing one or more electrical interconnects (although not shown) extending from the one or more circuit devices 290 to each other or to any location within or outside of the apparatus 201. Still further, as described herein, the one or more circuit devices 290 may be located in a cavity within either of the first portion 220 or second portion 240, and as such, the one or more layers 224, 244 may not need to provide the one or more circuit devices but may still provide the one or more electrical interconnects.

The first portion 220 includes a first chain-structure portion 210 and the second portion 240 includes a second-chain-structure portion 230. When the first portion 220 and the second portion 240 are coupled as shown in FIG. 2, the first-chain-structure portion 210 and the second-chain-structure portion 230 form the testing structure 200 (e.g., the testing structure 200 forms a daisy chain strand connection that weaves between the two portions that are bonded together and is located at the interface to be tested). In this embodiment, the testing structure 200 includes one series circuit 203 extending from a first end 202 to a second end 204 around a hermetically-sealed region 280 and formed at an interface 250 (perpendicular to the axis 203) of the connection surface 226 of the first portion 220 and the connection surface 246 of the second portion 240.

The interface 250 between the connection surfaces 226, 246 of the first and second portions 220, 240 may include bonded oxide portions in locations other than where conductive elements are located (e.g., such as connection pads 212, 232 of the chain-structure portions 210, 230 described below). For example, such bonded oxide portions may be formed if an oxide bonding process is used to couple the first and second portions 220, 240.

The one or more layers 224 of the first portion 220 include one or more chain-structure segments 211 that form the first chain-structure portion 210 and the one or more layers 244 of the second portion 240 also include one or more chain-structure segments 231 that the form the second chain-structure portion 230. Each of the one or more chain-structure segments 211 includes at least two connection pads 212 located (e.g., exposed) at the connection surface 226 and at least one electrical interconnect 214 (represented schematically by dashed lines) electrically coupling the at least two connection pads 212. Further, each of the one or more chain-structure segments 231 also includes at least two connection pads 232 located (e.g., exposed) at the connection surface 246 and an electrical interconnect 234 (represented schematically by dashed lines) electrically coupling the at least two connection pads 232.

When the first portion 220 is coupled to the second portion 240 (as shown), each connection pad 212 of the one or more chain-structure segments 211 of the first portion 220 is electrically coupled to a connection pad 232 of the one or more chain-structure segments 231 of the second portion 240 to form the testing structure 200. In this embodiment, the testing structure 200 forms a single series circuit 203 (e.g., a daisy-chain strand connection) extending from a first end 202 to a second end 204 around at least a portion of the hermetically-sealed region 280 and formed at an interface 250 of the connection surface 226 of the first portion 220 and the connection surface 246 of the second portion 240. A first end 202 of the series circuit 203 of the testing structure 200 may be connection pad 218 of a chain-structure segment 211 of the first portion 220 and a second end 204 of the series circuit 203 of the testing structure 200 may be a connection pad 216 of a chain-structure segment 211 of the first portion 220. The connection pads 216, 218 may be utilized to the test the apparatus 100 to, e.g., confirm or validate hermeticity about the one or more hermetically-sealed areas 280, as described herein with reference to FIGS. 6-7. Although the testing structure 200 forms a single series circuit 203, in other embodiments, the testing structure may include more than one series circuit (see, e.g., testing structure 300 of FIG. 3).

As depicted in FIG. 2, the series circuit 203 only extends around a single side of the hermetically-sealed region 280. In one or more embodiments, the series circuits of the testing structures described herein may extend partially around and/or completely around the hermetically-sealed regions and lie along a plane orthogonal to an axis (e.g., axis 203). For example, in one embodiment, a series circuit of a testing structure may extend completely around a hermetically-sealed region such that the first end and the second of the series circuit are located next to each other (e.g., completing a loop). Further, in one or more embodiments, a testing structure may include two or more series circuits, each of the two or more series circuits extending partially around the different sides of the hermetically-sealed areas so as when utilized together completely surround the hermetically-sealed areas along a plane orthogonal to the axis (e.g., axis 203)/For example, a testing structure may include four series circuits, each of the four series circuits extending along a single different side (i.e., a different side from the other series circuits) of a square hermetically-sealed area. In effect, the four series circuits form a testing structure extending completely around the square hermetically-sealed area.

In at least one embodiment, one or more chain-structure segments may form a testing structure (e.g., including at least one series circuit) within the one or more layers of a single portion so as to, e.g., confirm or validate hermeticity within the one or more layers. Further, the testing structure may extend through more than two layers of the one or more layers of both of the first and the second portion. In such an embodiment, each chain-structure segment may include two or more connection pads and one or more electrical interconnects extending in multiple directions throughout the one or more layers.

Additionally, other functional circuitry may be formed within the one or more layers (e.g., within a circuit device of the one or more circuit devices) and incorporated into the testing structure in order to test the hermeticity of the hermetically-sealed regions. In such an embodiment, the connection pads located at either end of the series circuit for electrically coupling, e.g., to an external apparatus may be unnecessary. For example, such functional circuitry may include voltage or current monitoring devices, frequency sensitive components, etc. In other words, the testing structure and the apparatus to test the electrical circuit apparatus may be self-contained.

Figure 3:
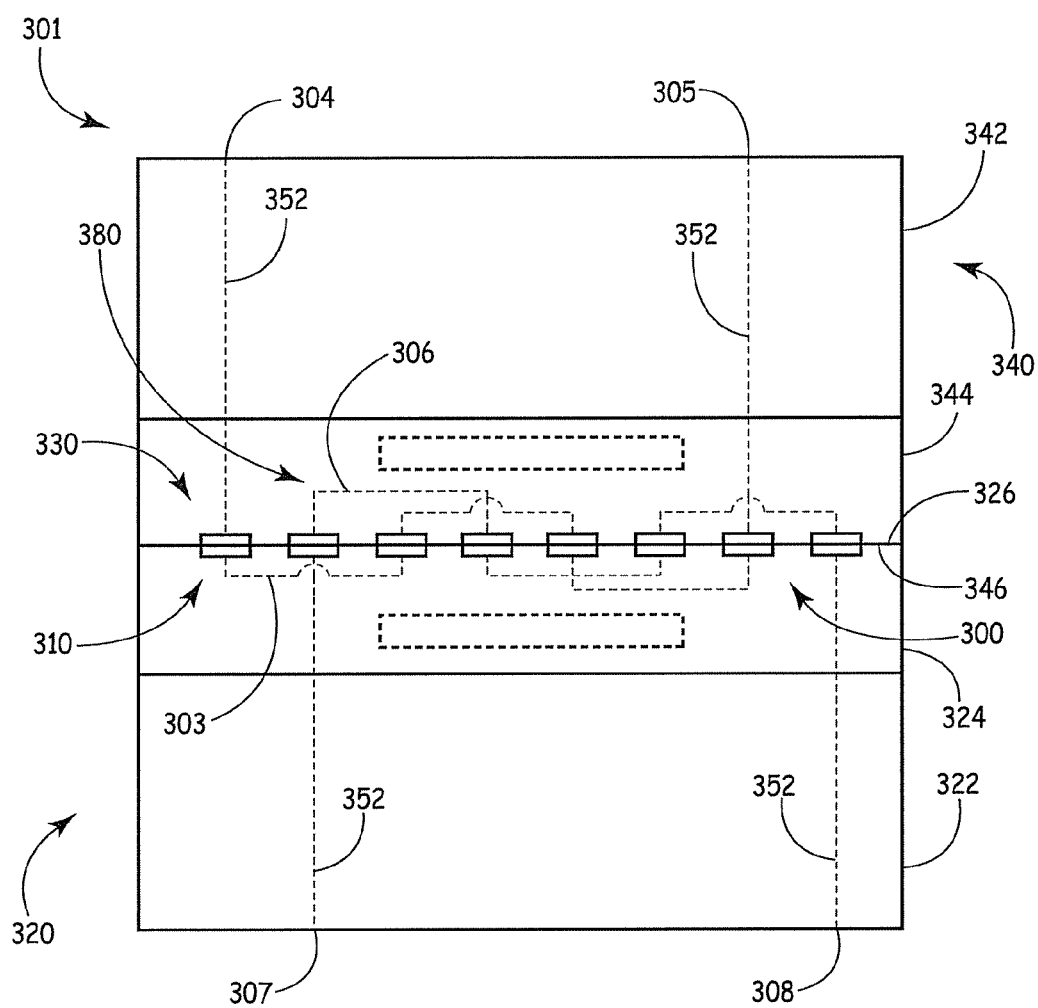
FIG. 3 is an illustrative cross-sectional side view of another exemplary embodiment of an apparatus such as generally shown in FIGS. 1A-1B.

FIG. 3 depicts an exemplary embodiment of apparatus 301 including a first portion 320 and a second portion 340 that may be similar to the first portion 220 and the second portion 240 of the apparatus 201 described herein with reference to FIG. 2. For example, the first and second portions 320, 340 of the apparatus 301 may include a substrate 322, 342, one or more layers 324, 344 terminating in a substantially planar connection surface 326, 346, one or more circuit devices, one or more chain-structure segments forming at least part of a first and the second chain-structure portion 310, 330 (each chain-structure segment including two connection pads and an electrical interconnect electrically coupling the two connection pads) that may be substantially similar to the substrates 222, 242, the one or more layers 224, 244 terminating in a substantially planar connection surface 226, 246, the one or more circuit devices 290, and the one or more chain-structure segments 211, 231 forming at least part of a first and the second chain-structure portions 210, 230 (each chain-structure portion including two connection pads 212, 232 and an electrical interconnect 214, 234 electrically coupling the two connection pads) of the first and second portions 220, 240 of the apparatus 201 described herein with reference to FIG. 2. As such, for simplicity, further detailed description of such features of the first and second portions 320, 340 will not be provided.

In the embodiment depicted in FIG. 3, however, the first portion 320 and the second portion 340 are substantially the same size such that no portion of the connection surfaces 326, 346 is exposed. As a result, each of the first portion 320 and the second portion 340 includes four interconnects 352 extending to an outer surface of either the first portion 320 or the second portion 340. In other embodiments, the first and the second portions 320, 340 may include more or less than four interconnects depending on the configuration. The interconnects 352 are electrically coupled to a testing structure 300 formed by the first chain-structure portion 310 of the first portion 320 and the second chain-structure portion 330 of the second portion 340 and extending at least partially around one or more hermetically-sealed portions 380.

The testing structure 300 includes a first series circuit 303 (extending from a first end 304 to second end 305) and a second series circuit 306 (extending from a first end 307 to a second end 308) interleaved with each other (e.g., the testing structure 300 may be a double stranded daisy chain including two or more points to check for connectivity). As used herein, two or more circuits "interleaved with each other" may be defined as having at least a portion of one of the two or more circuits located between a portion of another of the two more circuits. For example, every other connection pad and corresponding interconnect therebetween of each of the first and second portions 320, 340 may form the first series circuit 303 while the other connection pads and interconnect therebetween of each of the first and second portions 320, 340 form the second series circuit 306. In other words, the odd connection pads of the first and second portions 320, 340 may form the first series circuit 303 and the even connection pads may form the second series circuit 306.

As described herein, the testing structure may include more than two series circuits interleaved with each other. For example, every third contact pad may form one series circuit of three series circuits. Further, such interleaved series circuits need not be uniformly arranged. For example, one testing structure may include a first series circuit formed by the first contact pad and every other contact pad thereafter, a second series circuit formed by the second contact pad and every fourth contact pad thereafter, and a third series circuit formed by the fourth contact pad and every fourth contact pad thereafter. Further, such interleaved series circuit configurations may also be described using number sequences. For example, '1' could represent a connection pad of a chain-structure portion of a first series circuit, '2' could represent a connection pad of a chain-structure portion of a second series circuit, and '3' could represent a connection pad of a chain-structure portion of a third series circuit. Using such nomenclature, one configuration of a testing structure may be arranged 1-2-3-1-2-3-1-2-3-1-2-3, another may be arranged 1-1-1-2-2-2-1-1-1-2-2-2-1-1-1, or another may be arranged 1-2-1-2-3-1-2-1-2-3-1-2.

Testing structures including interleaved series circuits, e.g., series circuits 303, 306, may be utilized for redundancy, multiple tests, locating the site of loss of hermeticity, measuring the rate of loss of hermeticity, measuring the rate of external material penetration (such as moisture), determining the impact of hermeticity loss, etc.

Figure 4A:
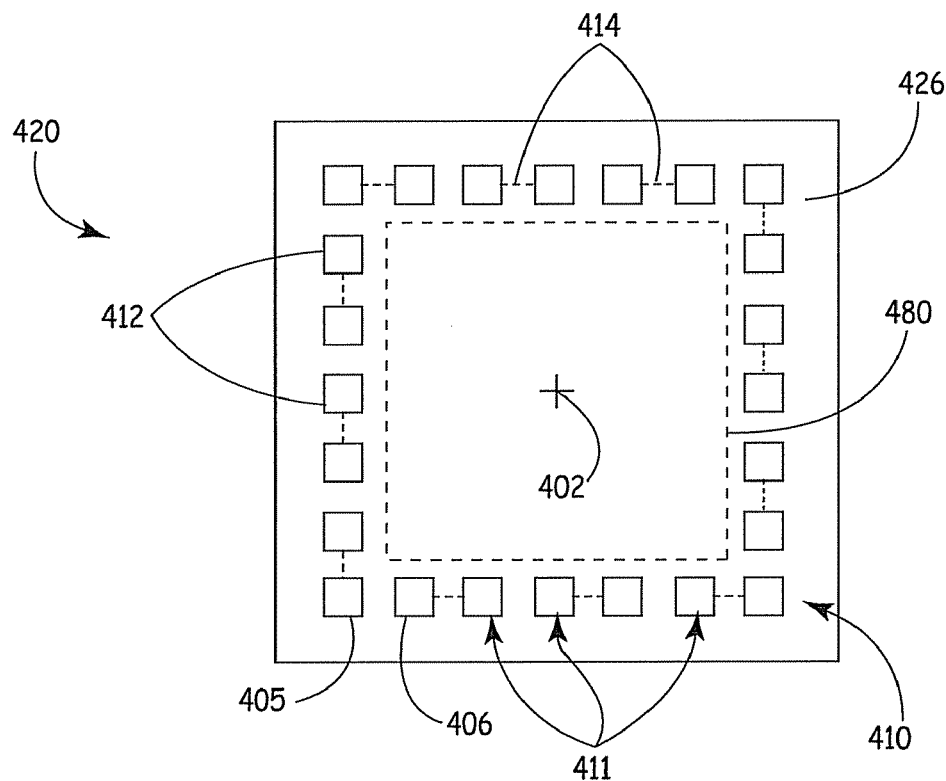
FIGS. 4A-4B are top and bottom views of a first portion and a second portion, respectively, of an exemplary embodiment of an apparatus as shown generally in FIGS. 1A-1B.
Figure 4B:
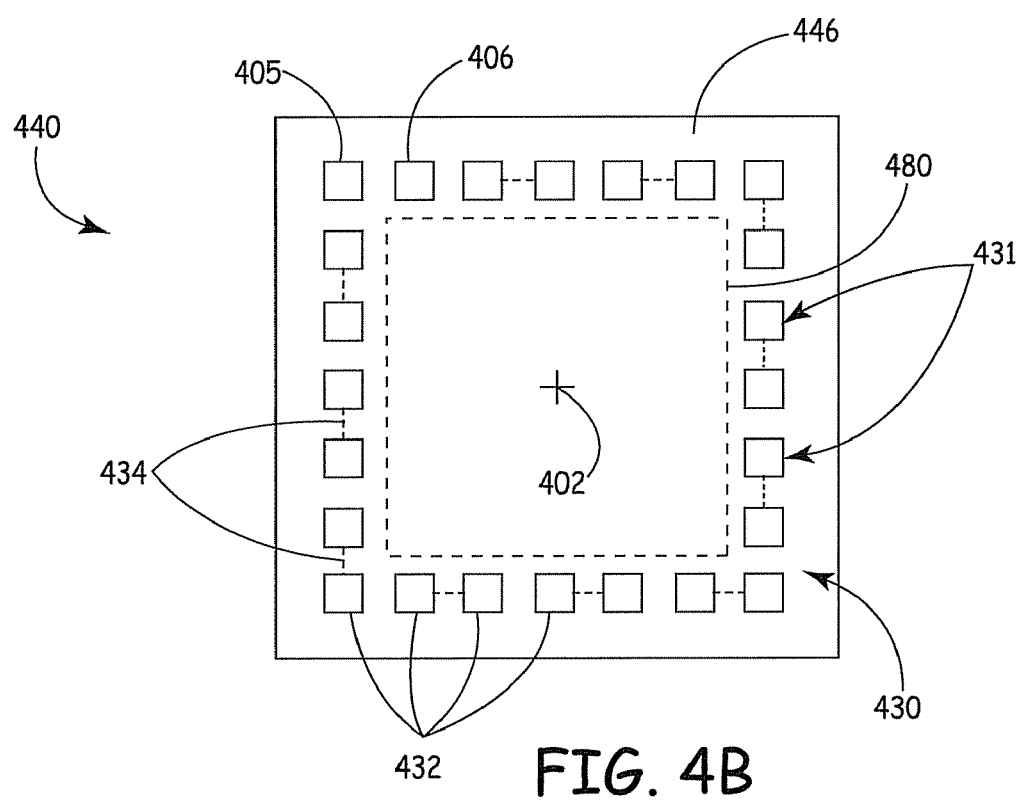

FIG. 4A is top view of a first portion 420 and FIG. 4B is a bottom view of a second portion 440 of an unassembled exemplary apparatus. In this view, the first chain-structure portion 410 of the first portion 420 and the second chain-structure portion 430 of the second portion 440 are shown extending around a hermetically-sealed region 480. Although not depicted, one or more circuit devices may be located coupled to or as part of one or both of the first portion 420 and the second portion 440. The one or more circuit devices may be arranged along axis 402 such that the hermetically-sealed region extends a distance further away from the axis 402 than the one or more circuit devices. Further, in this embodiment, the first chain-structure portion 410 and the second chain-structure portion 430 extend around the hermetically-sealed region 480 and are located a distance further away from the axis 402 than the one or more circuit devices (not shown) or hermetically-sealed region 480. The first portion 420 includes one or more chain-structure segments 411, each including two connection pads 412 and an electrical interconnect 414 (represented schematically with dashed lines), forming at least part of the first chain-structure portion 410. The second portion 440 also includes one or more chain-structure segments 431, each including two connection pads 432 and an electrical interconnect 434, forming at least part of the second chain-structure portion 430. As shown, the connection pads 412, 432 are exposed at the substantially planar connection surfaces 426, 446 of the first and the second portions 420, 440. When the first portion 420 and the second portion 440 are coupled together (e.g., bonded), the connection pads 412 of the first portion 420 will be electrically coupled to the connection pads 432 of the second portion 440 to complete the at least one series circuit of a testing structure that extends from a first end 405 to a second end 406.

In this embodiment (depicted in FIGS. 4A-4B), the first chain-structure portion 410 and the second chain-structure portion 430 extend around a single hermetically-sealed region 480 that includes most of the area of the first and the second connections surfaces 426, 446. In other embodiments, the first and the second portions 420, 440 may include more than one hermetically-sealed region that may be smaller and in different shapes than the hermetically-sealed region 480.

Figure 5A:
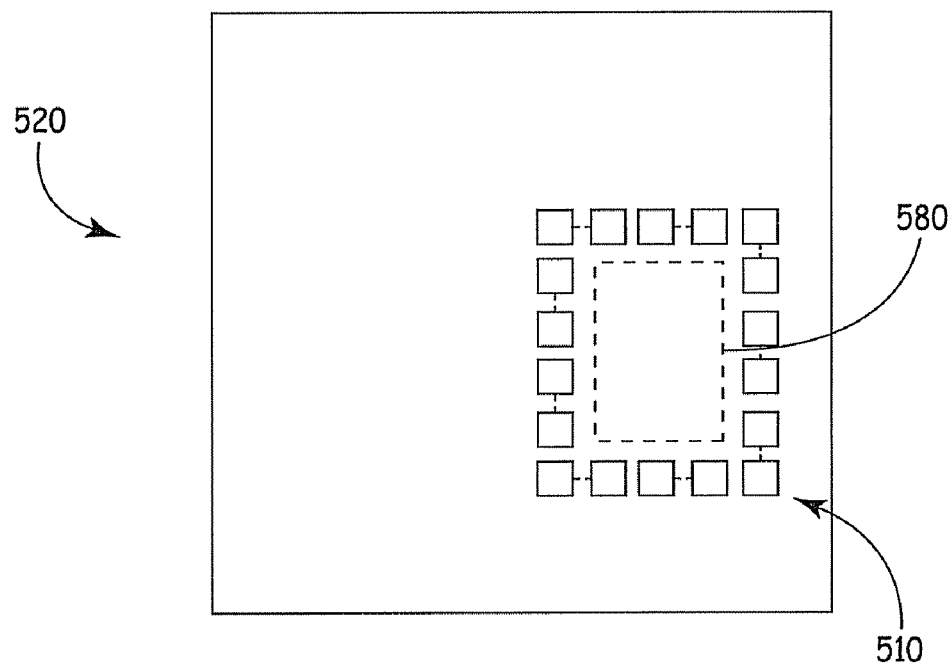
FIGS. 5A-5B are top and bottom views of a first portion and a second portion, respectively, of an exemplary embodiment of an apparatus as shown generally in FIGS. 1A-1B.
Figure 5B:
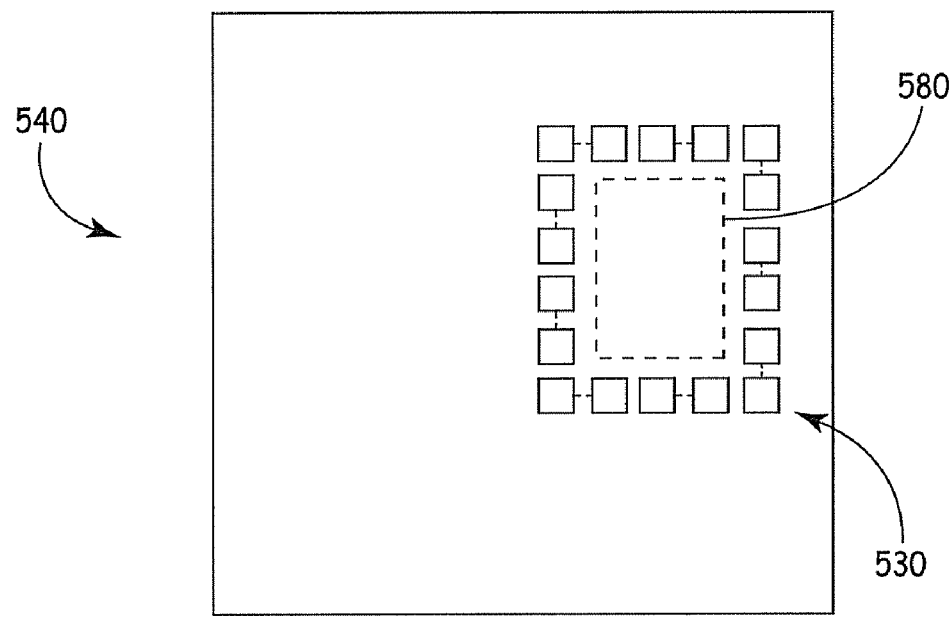

For example, FIG. 5A is top view of a first portion 520 and FIG. 5B is a bottom view of a second portion 540 of an unassembled exemplary apparatus that includes a hermetically-sealed region 580 that is smaller than the hermetically-sealed region 480 of the first and the second portions 420, 440 as shown in FIGS. 4A-4B. The first portion 520 includes a first chain-structure portion 510 and the second portion 540 includes a second chain-structure portion 530 that extend around the hermetically-sealed region 580.

Figure 6:
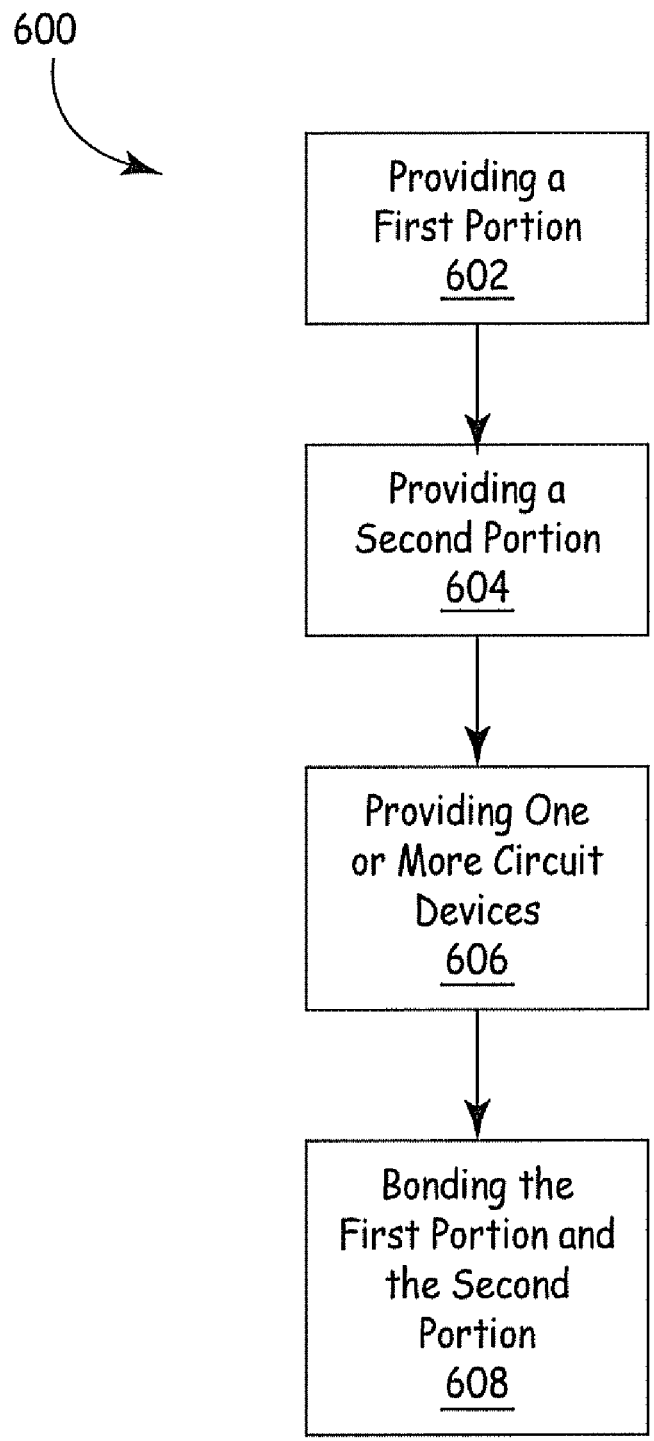
FIG. 6 is a block diagram of an exemplary embodiment of a method of forming an electrical circuit apparatus including a hermeticity testing structure as generally shown in FIGS. 1A-1B.

FIG. 6 is a block diagram generally illustrating a method of forming an exemplary apparatus including a hermeticity testing structure such as generally shown in FIGS. 1A-1B. The process 600 includes providing a first portion (block 602), providing a second portion (block 604), and providing one or more circuit devices (block 606).

Providing the first portion (block 602) and providing the second portion (block 604) may include fabricating a wafer (e.g., a doped semiconductor wafer) or starting with a pre-fabbed foundry wafer. All of the structures and/or features described herein may be formed within or on such wafers. For example, the first portion 20 of apparatus 10 as shown in FIGS. 1A-1B may be processed to form the first chain-structure portion 110 by fabricating (e.g., using any known fabrication processes including deposition, patterning, and/or etching) one or more additional layers on a substrate terminating at the connection surface 26.

The first portion 20 and/or the second portion 40 may be processed to form the one or more circuit devices in one or both of the first and the second portions (block 606) by fabricating (e.g., using any known fabrication processes including deposition, patterning, and/or etching) one or more additional layers on a substrate terminating at the connection surface 26. Further, the first portion 20 and/or the second portion 40 may be processed to form cavities within which the provided one or more circuit devices (block 606) may be located.

The process 600 further includes bonding (e.g., chemically bonding) the first portion to the second portion (block 608). For example, with reference to apparatus 10 of FIGS. 1A-1B, the connection surface 26 of the first portion 20 may be bonded to the connection surface 46 of the second portion 40 such that the connection pads (not shown) of the first and the second chain-structure portions 110, 120 are electrically coupled. In one embodiment, the connection surfaces 26, 46 may be bonded using an oxide bonding process forming an oxide interface therebetween. For example, the connection surfaces 26, 46 may each be etched, polished or planarized (e.g., using a chemical mechanical planarization or polishing) to expose conductive locations (for example, connection pads of the chain-structure portions, connections pads 30, 50, etc.) on the surfaces 26, 46 but leaving an oxide on the remaining portion of such surfaces 26, 46. Thereafter, the first portion 20 may be aligned with the second portion 40 to, for example, match the plurality of connection pads of the first portion 20 with the connection pads of the second portion 40. An oxide bond may then be performed resulting in bonded oxide portions at the interface of the connection surfaces 26, 46.

The method presented in FIG. 6 is only one example of a method that may be used to implement the apparatus described herein and is not to be taken as limiting to the scope of the disclosure provided herein. Various modifications to the process steps and/or timing or order of the process steps may be made to the method while still providing the benefits of apparatus described herein.

Figure 7:
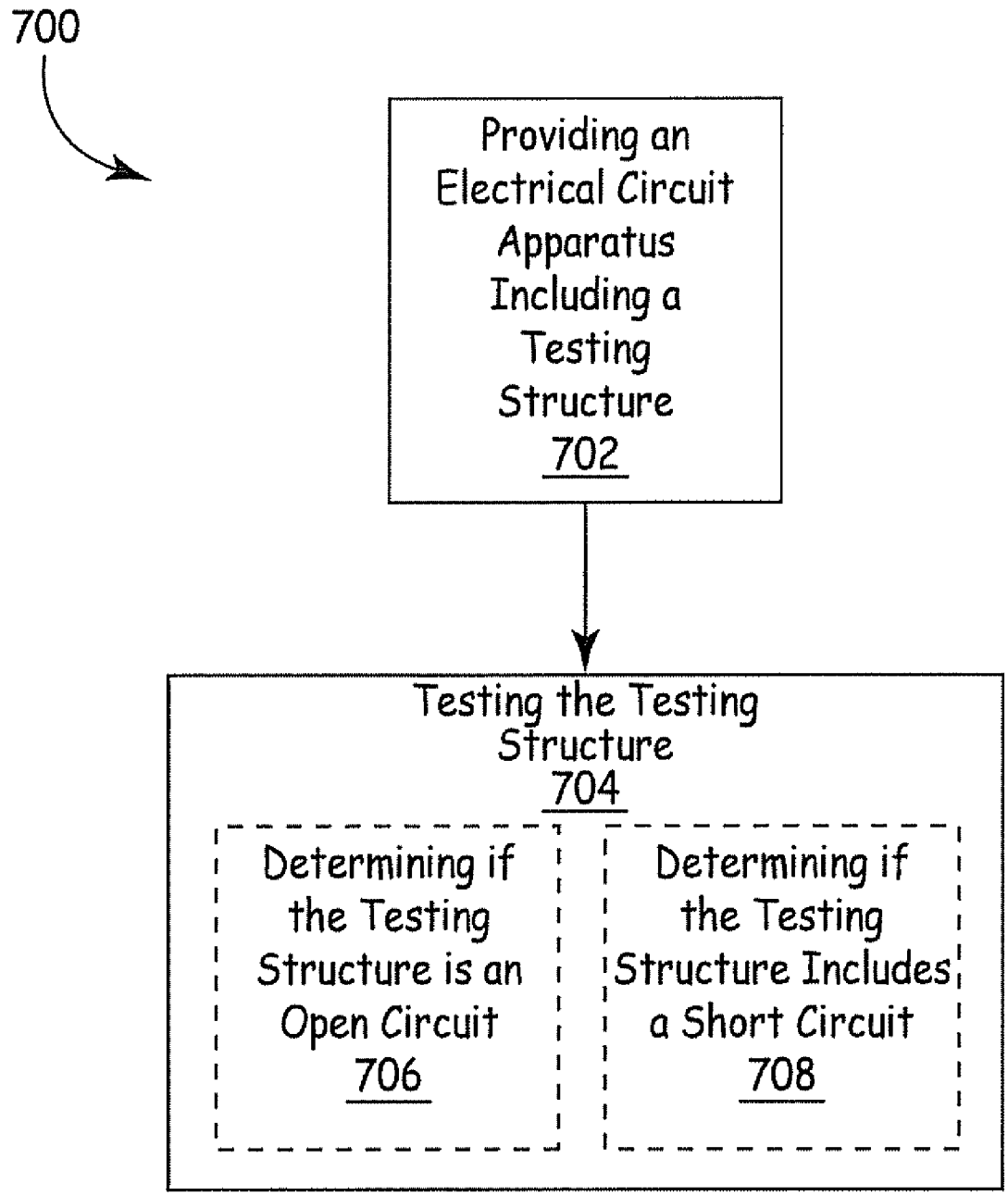
FIG. 7 is a block diagram of an exemplary embodiment of a method of testing the hermeticity of an electrical circuit apparatus including a hermeticity testing structure as generally shown in FIGS. 1A-1B.

FIG. 7 is a block diagram generally illustrating a method 700 of testing the hermeticity of an exemplary apparatus including a hermeticity testing structure such as generally shown in FIGS. 1A-1B. The hermeticity testing structures as described herein may be utilized to test that the interface between the first portion and the second portion is hermetically sealed (e.g., the testing structures, when electrically probed under different conditions, may produce different results based on whether or not the component is hermetic). For example, the testing structures may test that the first portion and the second portion have adequately, uniformly bonded to form a hermetic seal. Further, for example, the testing structures may test whether moisture has ingressed into the interface between the first and the second portion. Still further, the testing structures may test whether the first portion was properly aligned with the second portion when being assembled (e.g., bonded).

The method 700 includes providing an electrical circuit apparatus (block 702) and testing the testing structure of the electrical circuit apparatus (block 704). The testing structure of the electrical circuit apparatus may be tested (block 704) multiple ways to confirm or validate hermeticity about one or more hermetically-sealed areas. Two such tests are depicted inside block 704.

For example, the method 700 may include determining if the testing structure is an open circuit (block 706). The testing structure may include a series circuit extending from a first end to a second end around one or more hermetically-sealed regions and formed at an interface between the connection surfaces of the first and second portions of an exemplary electrical circuit apparatus, e.g., as depicted generally in FIGS. 1A-1B. At least one technique for determining if the testing structure is an open circuit may be measuring a resistance across the at least one series circuit and comparing the measured resistance to a selected value (e.g., a large resistance value) to determine if the at least one series circuit is complete. If the testing structure is determined to be an open circuit (i.e., an incomplete circuit), then the contact pads of the first portion and the second portion forming part of the testing structure may not be electrically coupled which, e.g., may indicate that the electrical circuit apparatus is not hermetically sealed (e.g., that the first portion and the second portion have not been bonded so as to form one or more hermetically-sealed regions).

Further, for example, the method 700 may include determining if the testing structure includes a short circuit (block 708). The testing structure may include two series circuits interleaved with each other extending around one or more hermetically-sealed regions and formed at an interface between the connection surfaces of the first and second portions of an exemplary electrical circuit apparatus, e.g., as depicted generally in FIGS. 1A-1B. At least one technique for determining if the testing structure includes a short circuit may be applying a voltage across a first series circuit of the at least two series circuits, measuring a voltage across a second series circuit of the at least two series circuits, and comparing the measured voltage across the second series circuit to the applied voltage across the second series circuit to determine if the at least two series circuits are electrically coupled (i.e., short circuited to each other). If the testing structure is determined to include a short circuit (e.g., having a first series circuit electrically coupled to a second series circuit), then moisture may be electrically coupling the first series circuit to the second series circuit which, e.g., may indicate that the hermetically-sealed regions of the apparatus have been compromised by moisture (e.g., the apparatus may have lost hermeticity). Further, if the testing structure is determined to include a short circuit, then the contact pads of the first series circuit forming part of the testing structure may not be electrically coupled and instead may be coupled to the second series circuit which, e.g., may indicate that the electrical circuit apparatus is not hermetically sealed (e.g., that the first portion and the second portion have not been bonded so as to form one or more hermetically-sealed regions).

Any features, components, and/or properties of any of the embodiments described herein may be incorporated into any other embodiment(s) described herein.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the disclosure, will be apparent upon reference to this description.

The invention claimed is:

1. An electrical circuit apparatus comprising:
 a first portion comprising a first chain-structure portion of a testing structure, the first portion comprising:
  a substantially-planar connection surface,
  a substrate provided from a wafer, and
  one or more chain-structure segments forming at least a part of the first chain-structure portion, each chain-structure segment comprising:
   two connection pads exposed at the connection surface, and
   an electrical interconnect electrically coupling the two connection pads;
 a second portion comprising a second chain-structure portion of the testing structure, the second portion comprising:
  a substantially-planar connection surface,
  a substrate provided from a wafer, and
  one or more chain-structure segments forming at least a part of the second chain-structure portion, each chain-structure segment comprising:
   two connection pads exposed at the connection surface, and
   an electrical interconnect electrically coupling the two connection pads; and
 one or more circuit devices comprising electrical circuitry, wherein the one or more circuit devices are located in one or more hermetically-sealed regions,
 wherein the connection surface of the first portion is bonded to the connection surface of the second portion, wherein each connection pad of one or more chain-structure segments of the first portion is electrically coupled to a connection pad of the one or more chain-structure segments of the second portion to form the testing structure, wherein the testing structure comprises at least one series circuit extending from a first end to a second end around the one or more hermetically-sealed regions and formed at an interface of the connection surface of the first portion and the connection surface of the second portion.

2. The apparatus of claim 1, wherein the first portion further comprises one or more layers formed on the substrate terminating at the connection surface, wherein the one or more layers of the first portion comprise each chain-structure segment of the first portion, and wherein the second portion further comprises one or more layers formed on the substrate terminating at the connection surface, wherein the one or more layers of the second portion comprise each chain-structure segment of the second portion.

3. The apparatus of claim 2, wherein the one or more layers of at least the first portion further comprise a circuit device of the one or more circuit devices.

4. The apparatus of claim 3, wherein the one or more layers of the first portion further comprise contact pads electrically coupled to the circuit device and located at the connection surface, and wherein the one or more layers of the second portion further comprise a circuit device of the one or more circuit devices and contact pads electrically coupled to the circuit device and located at the connection surface, wherein the contact pads of the first portion are electrically coupled to the contact pads of the second portion to electrically couple the circuit device of the first portion to the circuit device of the second portion.

5. The apparatus of claim 2, wherein the one or more layers of at least the first portion define a cavity, wherein a circuit device of the one or more circuit devices is located within the cavity.

6. The apparatus of claim 1, wherein at least one of the first portion and the second portion comprises at least two interconnects extending to an outer surface of either the first portion or the second portion, wherein one of the at least two interconnects is electrically coupled to the testing structure at the first end of the electrical series and one of the at least two interconnects is electrically coupled to the testing structure at the second end of the electrical series.

7. The apparatus of claim 1, wherein the testing structure forms at least two series circuits interleaved with each other.

8. The apparatus of claim 1, wherein the substrate of the first portion and the substrate of the second portion comprise semiconductor substrates.

9. The apparatus of claim 1, wherein the one or more circuit devices form a part of an implantable medical device.

10. A method of forming an electrical circuit apparatus, wherein the method comprises:
  providing a first portion comprising a first chain-structure portion of a testing structure and a substantially-planar connection surface, wherein providing the first portion comprises:
    providing a substrate provided from a wafer, and
    providing one or more chain-structure segments, wherein the one or more chain-structure segments faun at least a part of the first chain-structure portion, each chain-structure segment comprising:
      two connection pads exposed at the connection surface, and
      an electrical interconnect electrically coupling the two connection pads;
  providing a second portion comprising a second chain-structure portion of the testing structure and a substantially-planar connection surface, wherein providing the second portion comprises:
    providing a substrate provided from a wafer, and
    providing one or more chain-structure segments, wherein the one or more chain-structure segments form at least a part of the second chain-structure portion, each chain-structure segment comprising:
      two connection pads exposed at the connection surface, and
      an electrical interconnect electrically coupling the two connection pads;
  providing one or more circuit devices comprising electrical circuitry, wherein the one or more circuit devices are located in one or more hermetically-sealed regions; and
  bonding the connection surface of the first portion to the connection surface of the second portion, wherein each connection pad of one or more chain-structure segments of the first portion is electrically coupled to a connection pad of the one or more chain-structure segments of the second portion to form the testing structure, wherein the testing structure comprises at least one series circuit extending from a first end to a second end around the one or more hermetically-sealed regions and formed at an interface of the connection surface of the first portion and the connection surface of the second portion.

11. The method of claim 10, wherein providing the first portion further comprises forming one or more layers on the substrate terminating at the connection surface, wherein the one or more layers of the first portion comprise each chain-structure segment of the first portion, and wherein providing the second portion further comprises forming one or more layers formed on the substrate terminating at the connection surface, wherein the one or more layers of the second portion comprise each chain-structure segment of the second portion.

12. The method of claim 10, wherein providing the first portion and the second portion further comprises forming at least two interconnects extending to an outer surface of either the first portion or the second portion, wherein one of the at least two interconnects is electrically coupled to the testing structure at the first end of the electrical series and one of the at least two interconnects is electrically coupled to the testing structure at the second end of the electrical series.

13. The method of claim 10, wherein the testing structure forms at least two series circuits interleaved with each other.

14. The method of claim 10, wherein the substrate of the first portion and the substrate of the second portion comprise semiconductor substrates.

15. A method of testing an electrical circuit apparatus, wherein the method comprises:
  providing an electrical circuit apparatus comprising:
    a first portion comprising a first chain-structure portion of a testing structure, the first portion comprising:
      a substantially-planar connection surface,
      a substrate provided from a wafer, and
      one or more chain-structure segments forming at least a part of the first chain-structure portion, each chain-structure segment comprising:
        two connection pads exposed at the connection surface, and
        an electrical interconnect electrically coupling the two connection pads,
    a second portion comprising a second chain-structure portion of the testing structure, the second portion comprising:
      a substantially-planar connection surface,
      a substrate provided from a wafer, and
      one or more chain-structure segments forming at least a part of the second chain-structure portion, each chain-structure segment comprising:
        two connection pads exposed at the connection surface, and
        an electrical interconnect electrically coupling the two connection pads, and
    one or more circuit devices comprising electrical circuitry formed, wherein the one or more circuit devices define one or more hermetically-sealed regions,
    wherein the connection surface of the first portion is bonded to the connection surface of the second portion, wherein each connection pad of one or more chain-structure segments of the first portion is electrically coupled to a connection pad of the one or more chain-structure segments of the second portion to form the testing structure, wherein the testing structure comprises at least one series circuit extending from a first end to a second end around the one or more hermetically-sealed regions and formed at an interface of the connection surface of the first portion and the connection surface of the second portion; and testing the at least one series circuit of the testing structure to confirm or validate hermeticity about the one or more hermetically-sealed areas.

16. The method of claim 15, wherein testing the at least one series circuit of the testing structure comprises determining if the at least one series circuit is open.

17. The method of claim 15, wherein the testing structure comprises at least two series circuits interleaved with each other, wherein testing the at least one series circuit of the testing structure comprises determining if a first series circuit of the at least two series circuits is shorted to a second series circuit of the at least two series circuits.

18. The method of claim 15, wherein the first portion further comprises one or more layers formed on the substrate terminating at the connection surface, wherein the one or more layers of the first portion comprise each chain-structure segment of the first portion, and wherein the second portion further comprises one or more layers formed on the substrate terminating at the connection surface, wherein the one or more layers of the second portion comprise each chain-structure segment of the second portion.

19. The method of claim 15, wherein one or both of the first portion or the second portion comprises at least two interconnects extending to an outer surface of either the first portion or the second portion, wherein one of the at least two interconnects is electrically coupled to the testing structure at the first end of the electrical series and one of the at least two interconnects is electrically coupled to the testing structure at the second end of the electrical series.

20. The method of claim 15, wherein the substrate of the first portion and the substrate of the second portion comprise semiconductor substrates.

* * * * *